(12) United States Patent
Marinus et al.

(10) Patent No.: US 8,491,161 B2
(45) Date of Patent: Jul. 23, 2013

(54) LIGHTING DEVICE

(75) Inventors: Antonius Adrianus Maria Marinus, Eindhoven (NL); Theodoor Cornelis Treurniet, Eindhoven (NL); Marco Van As, Eindhoven (NL); Mark Johannes Antonius Verhoeven, Deurne (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 559 days.

(21) Appl. No.: 12/531,698

(22) PCT Filed: Mar. 19, 2008

(86) PCT No.: PCT/IB2008/051042
§ 371 (c)(1),
(2), (4) Date: Sep. 17, 2009

(87) PCT Pub. No.: WO2008/117211
PCT Pub. Date: Oct. 2, 2008

(65) Prior Publication Data
US 2010/0096967 A1  Apr. 22, 2010

(30) Foreign Application Priority Data
Mar. 26, 2007  (EP) .................................... 07104906

(51) Int. Cl.
*F21V 29/02* (2006.01)
(52) U.S. Cl.
USPC ........................................... 362/294; 362/800
(58) Field of Classification Search
USPC .................... 362/294, 373; 313/46, 13, 45
See application file for complete search history.

(56) References Cited

U.S. PATENT DOCUMENTS

| 5,303,555 | A | 4/1994 | Chrysler et al. |
| 7,144,135 | B2 | 12/2006 | Martin et al. |
| 7,258,464 | B2 * | 8/2007 | Morris et al. .................. 362/264 |
| 7,556,406 | B2 * | 7/2009 | Petroski et al. ............... 362/294 |
| 2006/0193139 | A1 | 8/2006 | Sun et al. |
| 2007/0139938 | A1 * | 6/2007 | Petroski et al. ............... 362/373 |
| 2009/0084866 | A1 * | 4/2009 | Grimm et al. ..................... 239/4 |
| 2009/0109625 | A1 * | 4/2009 | Booth et al. .................. 361/702 |

FOREIGN PATENT DOCUMENTS

| EP | 1715566 A2 | 10/2006 |
| GB | 2420172 A | 5/2006 |
| JP | 2005078029 A | 3/2005 |
| WO | 2004095593 A1 | 11/2004 |
| WO | 2005008348 A2 | 1/2005 |

OTHER PUBLICATIONS

Toon, J.: "Keeping Cool: Synthetic Jet and Droplet Atomization Technologies Meet Broad Range of Electronic Thermal Management Needs"; Reasearch Horizons, 2 Page Document.

* cited by examiner

*Primary Examiner* — Jong-Suk (James) Lee
*Assistant Examiner* — Leah S Macchiarolo
(74) *Attorney, Agent, or Firm* — Mark L. Beloborodov (57) ABSTRACT

The invention relates to a lighting device comprising a light source (31) which is mounted on a heat sink (32) having an outer contour (34). Furthermore, it comprises a cooling device (35) for dynamically cooling the light source via cooling of the heat sink by means of a fluid flowing alongside the contour of the heat sink, the cooling device having one or a plurality of cooling openings (36, 43). The cooling device is a vibrating membrane cooling system for generating a sequence of fluid pulses (39). The cooling openings are arranged alongside the heat sink. The light source comprises optical means (33) for collimating and directing light originating from the light source during operation, while the contour of the heat sink has a shape similar to that of the optical means.

14 Claims, 8 Drawing Sheets

LIGHTING DEVICE

CROSS-REFERENCE TO RELATED APPLICATIONS

This application is a national stage application under 35 U.S.C. §371 of International Application No. PCT/IB2008/051042 filed on Mar. 19, 2008, which claims priority to European Application No. 07104906.8, filed on Mar. 26, 2007, incorporated herein by reference.

FIELD OF THE INVENTION

The invention relates to a lighting device.

BACKGROUND OF THE INVENTION

Such a lighting device is known from GB2420172A. The known lighting device comprises a light source which is mounted on a heat sink. The heat sink has a contour. It has also a cooling device which is an electric fan for dynamically cooling the light source via cooling of the heat sink by means of a gas flow. The known lighting device has the drawback that use of the fan for the purpose of cooling has a number of limitations. For example, much of the circulated gas, for example, air bypasses the heat sink and does not mix well with the thermal boundary layer that is formed on the cooling fins of the heat sink. A fan placed directly opposite or over said heat sink has "dead areas" where its motor assemblies block the airflow, causing, for example, a turbulent gas flow. Furthermore, a fan uses relatively much energy, creates audible noise and takes up relatively much space.

OBJECT AND SUMMARY OF THE INVENTION

It is an object of the invention to provide a lighting device of the type described in the opening paragraph, in which the above-mentioned drawback is counteracted. To this end, the lighting device is characterized in that it comprises
at least one light source which is mounted on a heat sink having a contour,
a cooling device for dynamically cooling the light source via cooling of the heat sink by means of a fluid flowing alongside the heat sink, the cooling device having at least one cooling opening, and in that
the cooling device is a vibrating membrane cooling system for generating a sequence of fluid pulses.

Experiments have shown that this cooling mode is significantly more effective than the conventional cooling mode using an electric fan. In practice, the vibrating membrane cooling system was found to produce two to three times more cooling with two-thirds less energy input than with a conventional fan. The system is even more efficient when the vibrating membrane cooling system is embodied as a resonance cooling system. The vibrating membrane cooling system is simple and has no friction parts susceptible to wear, while the synthetic jet module (=vibrating membrane cooling system) resembles a tiny stereo speaker in which a diaphragm is mounted within a cavity (=vibrating membrane chamber) that has one or more orifices (=cooling openings). The cooling system may comprise one or more synthetic jet modules and heat sinks, which modules can be located above, below or next to the light source. The cooling system is usable for cooling both the light source and/or other parts of the lighting device, for example, the driver means (=electronic circuit).

An embodiment of the lighting device is characterized in that at least one cooling opening has at least two, preferably at least four orifices, and in that said cooling orifices are arranged alongside the contour of the heat sink. The cooling device thus creates a cooling pattern that has a shape similar to the contour of the heat sink, with the result that the heat sink is flushed with a fluid flow. A major part, for example, more than 50%, preferably more than 70%, more preferably more than 85% of the contour of the heat sink, which may be an inner contour, an outer contour or both an inner and an outer contour, is exposed to a fluid flow created by the cooling device. The more the contour is exposed, the better the cooling. The fluid may be a gas or a liquid. If the fluid is a gas, it is preferably air. Four openings, or orifices, allow creation of a three-dimensional arrangement of the openings and thus effective cooling of a three-dimensional heat sink, for example, by providing two cooling openings at its outer side flushing the outer contour and two other cooling openings at its inner side flushing the inner contour. If the contour is compliant with a curved surface/plane, it is also possible to substantially totally flush, for example, the outer side of the heat sink with flowing fluid by way of the three-dimensional arrangement of the cooling openings.

A further embodiment of the lighting device is characterized in that the light source comprises optical means for collimating and directing light originating from the light source during operation, the contour of the heat sink having a shape which is similar to that of the optical means. It is thus realized that the heat sink then takes up relatively little space as compared with known, conventional lighting devices comprising heat sinks. Despite the complex, three-dimensional shape of the heat sink, it still proved to be possible to substantially completely flush the heat sink with a fluid flow from the resonance cooling system, as it appeared to be possible to transport the fluid pulses. To this end, the lighting device is characterized in that the cooling system has a vibrating membrane chamber to which each cooling opening is connected via a respective fluid pulse conductor. As long as the fluid pulse is within the fluid pulse conductor, it is stable, i.e. no fluid is extracted or sucked from the environment and turbulence does not occur. Once the fluid pulse exits the cooling opening, it influences the environmental atmosphere and extracts or sucks fluid from its direct surrounding, resulting in the fluid pulse becoming unstable and causing or becoming a turbulent fluid flow. The fluid pulse conductor preferably has a length which is equal to N times half a wavelength $\lambda$ (lambda) of the fluid pulse sequence as generated by the vibrating membrane during operation, preferably still in a resonating state. The vibrating membrane cooling system then appears to operate in the most efficient way, with relatively little loss of energy.

Experiments further proved that tubular conductors are particularly usable as fluid pulse conductors. A flexible tube is preferably used because an accurate, desired position of the cooling opening with respect to the heat sink can then be obtained easily.

To further enhance the substantially total flushing of the heat sink by the fluid flow, the lighting device is characterized in that at least one of the cooling openings is shaped as a showerhead. Flushing and hence cooling of the heat sink (and as a result thereof, cooling of the light source) is then even further improved.

Another embodiment of the lighting device is characterized in that the vibrating membrane chamber is spaced apart from the light source, preferably at a distance which is at least three times, preferably at least seven times a largest dimension of the heat sink. The possibility of transporting the fluid pulse sequence over relatively large distances without significant energy losses enables the vibrating membrane chamber to be positioned at a relatively large distance from the heat sink. As possibly still some noise may be generated by the vibrating membrane during operation of the lighting device, the possibility of transporting the fluid pulse sequence allows the vibrating membrane chamber to be tucked away, for example, behind a false ceiling, with the light source suspended from said ceiling via the fluid pulse conductor.

A further embodiment of the lighting device is characterized in that it is provided with a control circuit for controlling the cooling device. It is thus simply possible to control or meet the changing thermal requirements imposed on the lighting device. To this end, the circuit may be provided with a sensor which detects the temperature of the heat sink, compares it with set values and supplies steering signals to the cooling device. The cooling device may be designed in such a way that it cools both the light source and the control circuit.

A further embodiment of the lighting device is characterized in that the light source is at least one light-emitting diode (LED). Lighting devices comprising LEDs are known to suffer from heat management problems, particularly because cooling devices take up relatively much space in comparison with the relatively small LEDs. The vibrating membrane cooling system is particularly suitable for cooling LEDs because of its compactness and high efficiency. The LEDs may have a white (W), red (R), green (G), blue (B) or amber (A) emission spectrum. A combination thereof leads to any desired light spectrum that falls within the color space made up by the color coordinates of the WRGBA starting LEDs. The LEDs can be applied in combination with secondary converting light-emitting elements situated directly on or remote from the LEDs, for example, remote phosphors or lumiramics.

Another embodiment of the lighting device is characterized in that the heat sink is shaped as a plurality of annular cooling fins arranged concentrically around an axis of the heat sink and spaced apart by annular slits. It is thus possible to have an annular arrangement of small light sources, for example, LEDs, to be mounted on one heat sink and yet effectively cooling each light source. In the case of a substantially annular arrangement of the light sources, heat sinks having a round, triangular, rectangular, square, hexagonal, or octagonal shape in a plane perpendicular to the axis of the heat sink are particularly suitable. It is alternatively possible to have a plurality of heat sinks for cooling one or more arrangements of different light sources, of course in dependence on the amount of light sources involved, or it is alternatively possible for one cooling system to cool a plurality of light sources. To enhance the cooling efficiency, it is preferred if the cooling openings are positioned in or opposite respective slits of the heat sink or sinks. The lighting device of the invention can be used as a stand-alone unit or may form part of a network comprising other electric devices.

BRIEF DESCRIPTION OF THE DRAWINGS

The invention will now be elucidated with reference to the drawings, in which.

DESCRIPTION OF EMBODIMENTS

Figure 1A:
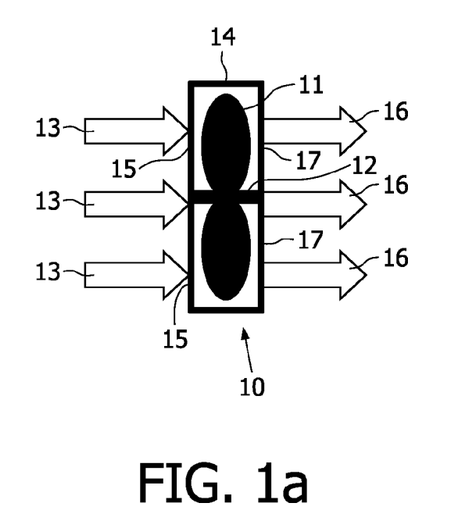
FIGS. 1a-1b are schematic views of cooling devices as used in prior-art lighting devices.
Figure 1B:
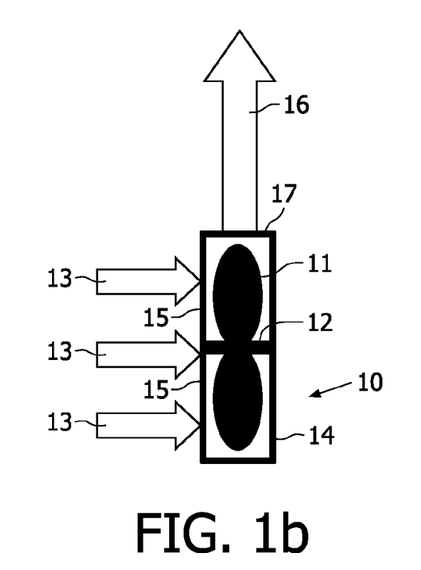

FIGS. 1a-b show diagrammatically two basic shapes of an electric fan 10 as a cooling device. Each fan comprises a housing 14 and a propeller 11 rotating in said housing around a fan axis 12. In operation, an airflow is created; an inward flow 13 enters the housing through an inlet opening 15 and exits the housing as an outward flow 16 through an outlet or cooling opening 17. In FIG. 1a, the inlet and outlet openings are positioned opposite each other, resulting in an axial airflow. In FIG. 1b, the inlet and outlet openings are positioned at an angle of 90° with respect to each other, the inlet flow being along the fan axis, the outlet flow being perpendicular to the fan axis 12. In practice it appeared that the fan operates very inefficiently when outlet openings are provided in more than one direction.

Figure 2:
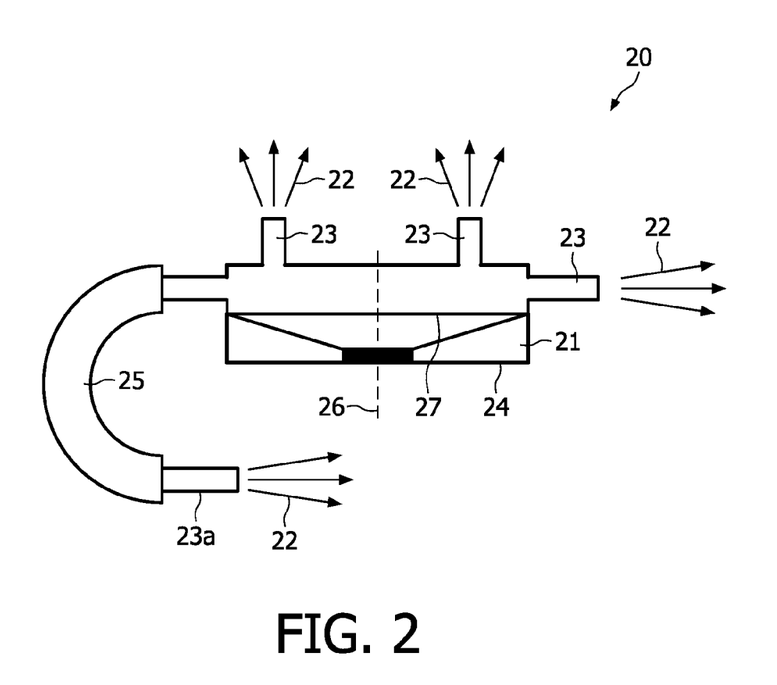
FIG. 2 is a schematic view of a cooling device as used in lighting devices according to the invention.

FIG. 2 shows diagrammatically a vibrating membrane cooling device 20. The vibrating membrane cooling device comprises a chamber 21 with a wall 24. The chamber is provided with a membrane 27 which vibrates, preferably resonates, along a vibration axis 26, and creates a sequence of fluid pulses 22 during operation, which pulses exit the chamber through cooling openings, or orifices, 23 provided in the wall 24. As shown, some orifices are provided substantially in the wall 24 itself, while other orifices, for example, 23a, are provided at some distance from the wall 24 and connected to the chamber via a tubular pulse conductor 25. For the efficiency of the vibrating membrane cooling device, it does not matter whether the openings are provided on one side or on various sides of the chamber and have various orientations with respect to the vibration axis.

Figure 3:
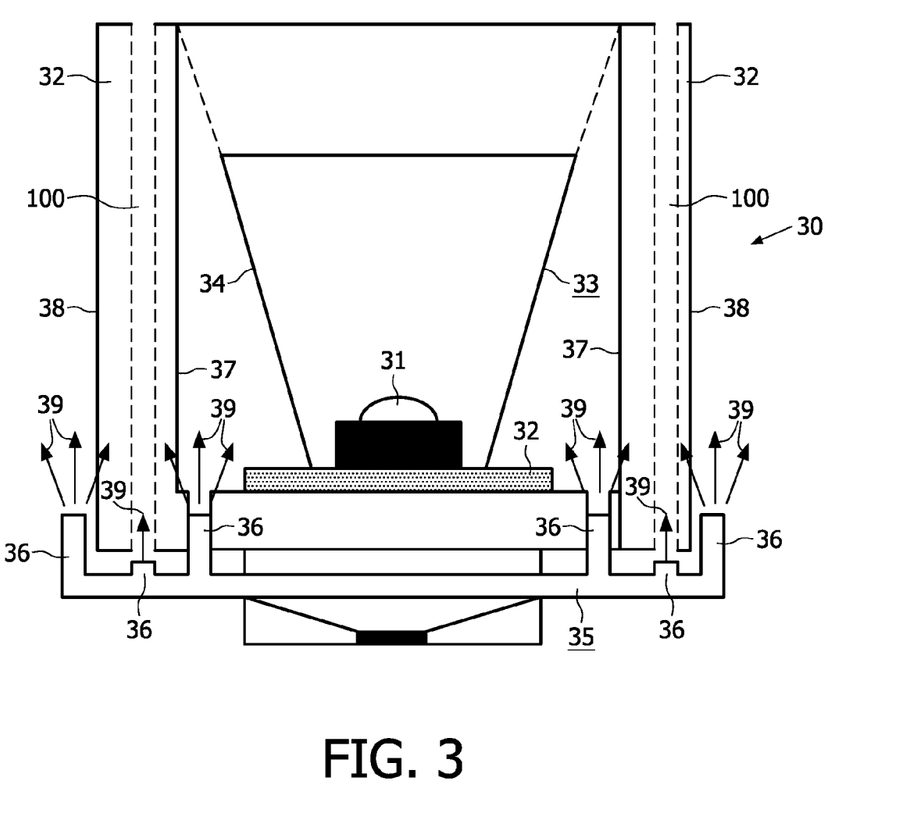
FIG. 3 is a schematic view of a first embodiment of a lighting device according to the invention.

FIG. 3 is a schematic view of a first embodiment of a lighting device 30 according to the invention. The lighting device comprises a light source 31, in the Figure a compact high-pressure mercury vapor discharge lamp, for example, a UHP lamp. The light source is mounted on a heat sink 32 and further comprises optical means 33, in the Figure a parabolic reflector 33. The heat sink substantially has a shape which is similar to an outer contour 34 of the reflector. A vibrating membrane cooling device 35, in the Figure a resonant cooling system analogous to the one shown in FIG. 2, is provided adjacent the heat sink. The device 35 has six orifices 36 that flush the heat sink with a sequence of fluid pulses 39 which, once out of the orifice, become a turbulent fluid flow, both on its inner 37 and outer contour/side 38. Furthermore, the heat sink comprises channels 100 into which fluid pulses 39 are supplied via respective cooling openings 36. As a result of the overall cooling of the heat sink, the light source is cooled very effectively.

Figure 4:
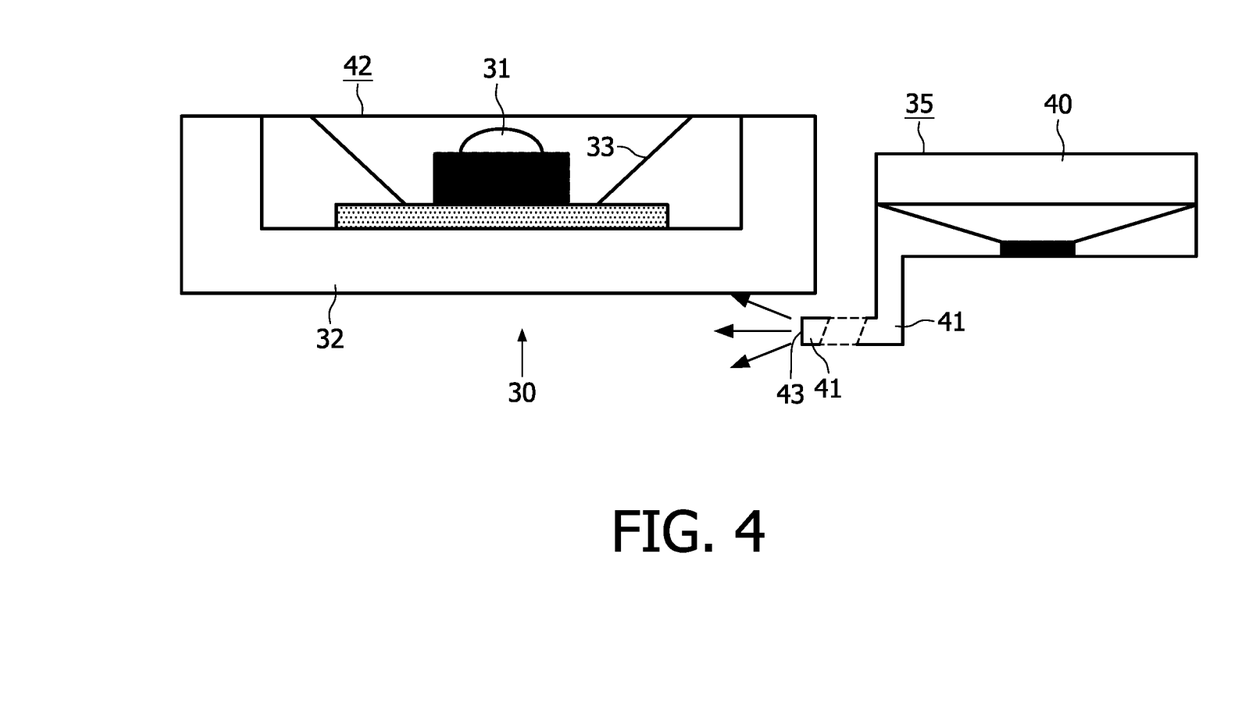
FIG. 4 is a schematic view of a second embodiment of a lighting device according to the invention.

FIG. 4 is a schematic view of a second embodiment of a lighting device 30 according to the invention. In this embodiment, the light source, in the Figure a part 42 comprising a white LED 31, optical means 33 and heat sink 32 is remote from a chamber 40 which forms part of the vibrating membrane cooling device 35. The fluid pulse sequence, in the Figure the fluid is air, is generated in the chamber and transported via an air pulse conductor 41 to the heat sink which is effectively cooled thereby. In this embodiment, the chamber has only one orifice 43. In an alternative arrangement (not shown), the remote part 42 is suspended via the air pulse conductor to a (false) ceiling and the chamber is tucked away in the ceiling or behind the false ceiling.

Figure 5:
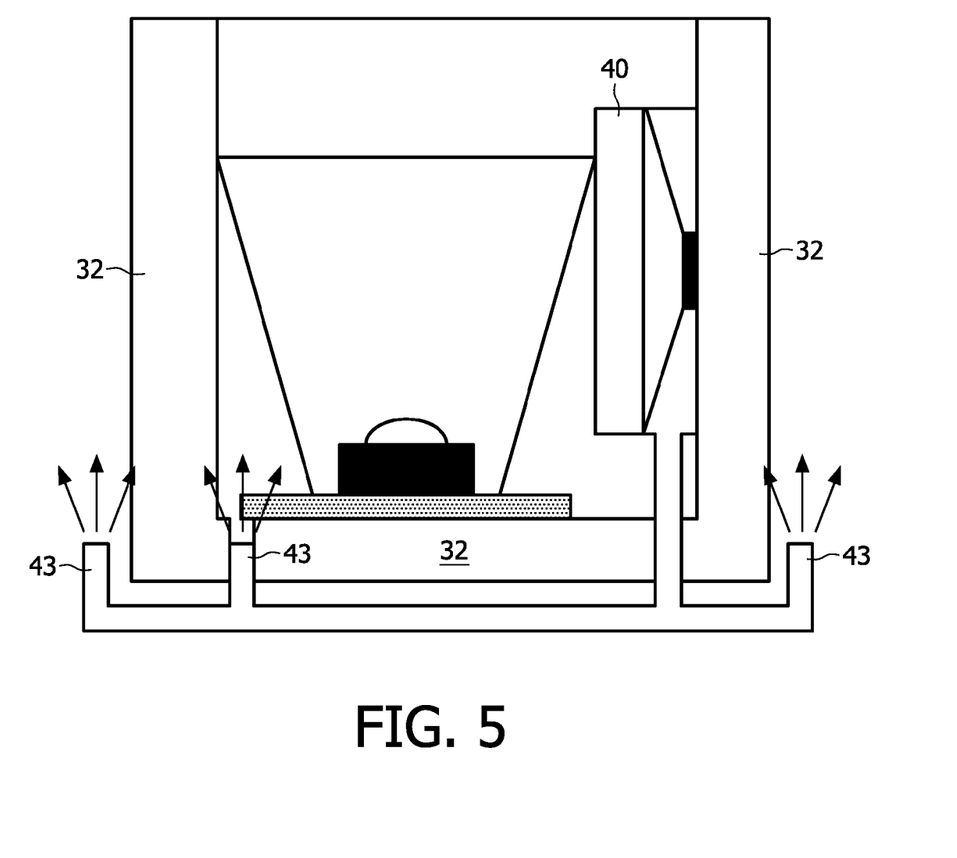
FIG. 5 is a diagrammatic view of a third embodiment of a lighting device according to the invention.

FIG. 5 is a diagrammatic view of a third embodiment of a lighting device according to the invention, in which the chamber 40 is positioned inside the heat sink 32. This has the advantage that the lighting device takes up even less space and allows an aesthetic design. In this embodiment, there are three orifices/cooling openings 43.

Figure 6:
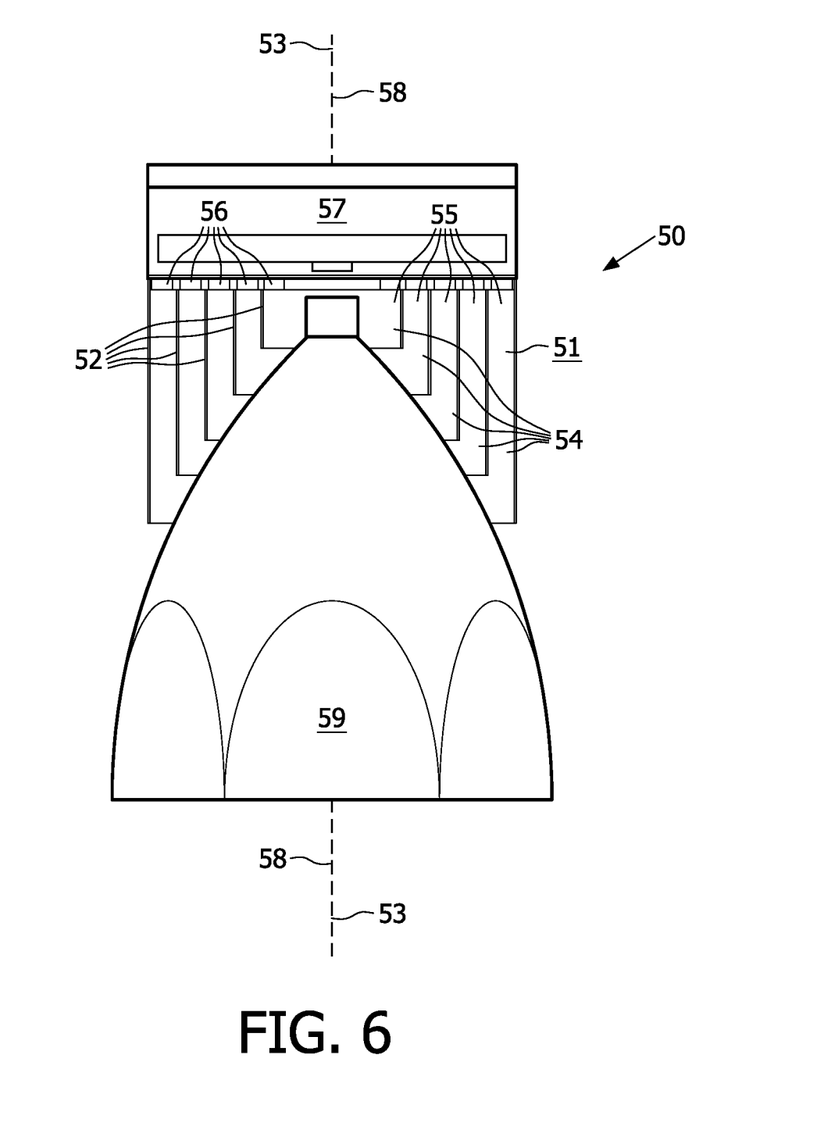
FIG. 6 is a side view of a fourth embodiment of a lighting device according to the invention.

FIG. 6 is a diagrammatic side view of a fourth embodiment of a lighting device 50 according to the invention. A heat sink 51 is provided, which has a number of annular cooling fins 52 arranged concentrically around an axis 53 of the heat sink, which axis, in this embodiment, coincides with an optical axis 58 of an optic reflector 59 for collimating and directing light emitted by the light source (see FIG. 7) during operation. Each pair of adjacent concentric fins is separated by respective slits 54. A respective orifice/cooling opening 56 of a resonance cooling device 57 is provided in a first end part 55 of each slit, the cooling openings jointly forming a showerhead.

Figure 7:
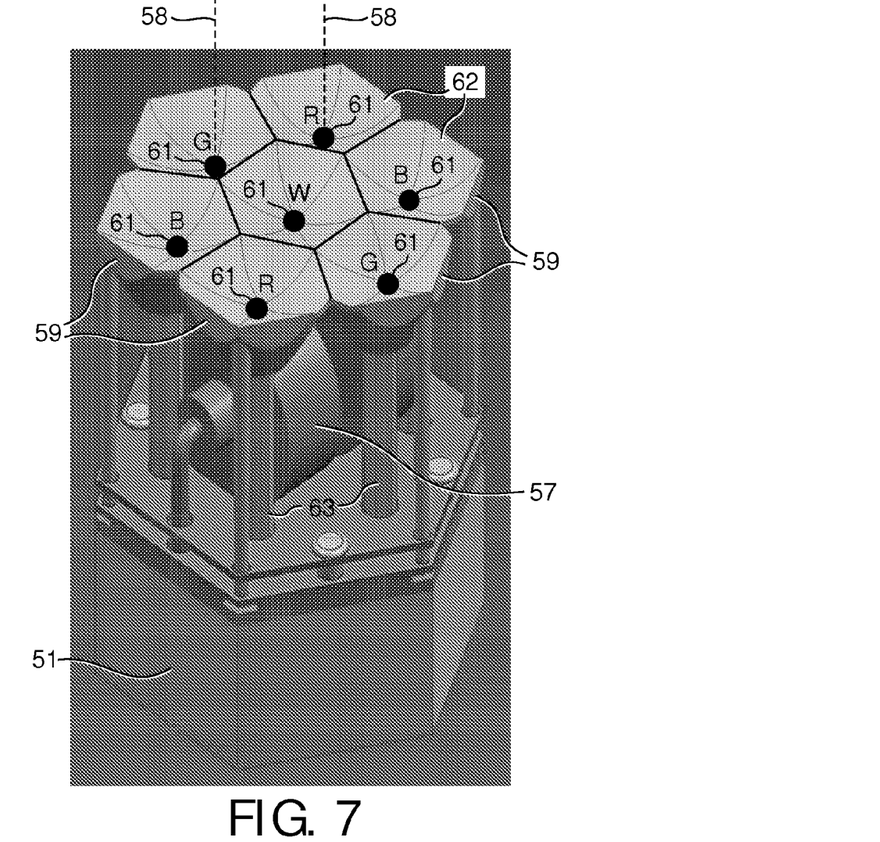
FIG. 7 is a perspective view of a plurality of lighting devices shown in FIG. 6.

FIG. 7 is a perspective view of a lighting system accommodating a total number of seven lighting devices as shown in FIG. 6. Each lighting device has a respective light source 61 and each LED has a respective optical means 59 and is mounted on a respective heat sink 51 via heat-conducting pipes 63. The heat sinks are cooled by a common resonance cooling device 57. The seven LEDs are arranged with six LEDs in a hexagonal configuration, i.e. two red R, two green G, and two blue B LEDs surrounding a central white LED W. Each reflector widens along its respective optical axis 58 from its respective light source 61 towards its respective light emission window 62. The resonance cooling device 57 is provided on a side of the reflector facing away from the light emission window. The lighting system further comprises control means (see FIG. 8) for controlling the cooling device.

Figure 8:
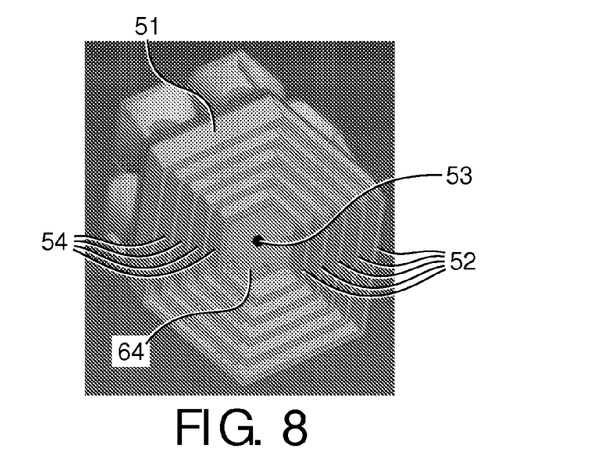
FIG. 8 is a bottom view of the lighting device shown in FIG. 7.

FIG. 8 is a bottom view of the lighting device shown in FIG. 7, in which the concentric, annular hexagonally structured fins 52 of the heat sink 51 are clearly visible. The cooling fins are separated by slits 54. The control circuit 64 is provided on the axis 53 of the heat sink and is surrounded by the most central cooling fin 52.

Figure 9A:
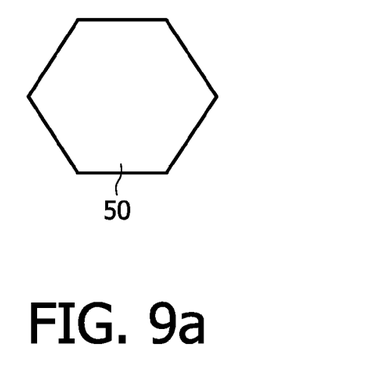
FIGS. 9a-9c are schematic representations of a single lighting device shown in FIG. 6 as well as some arrangements of a plurality of lighting devices shown in FIG. 6.
Figure 9B:
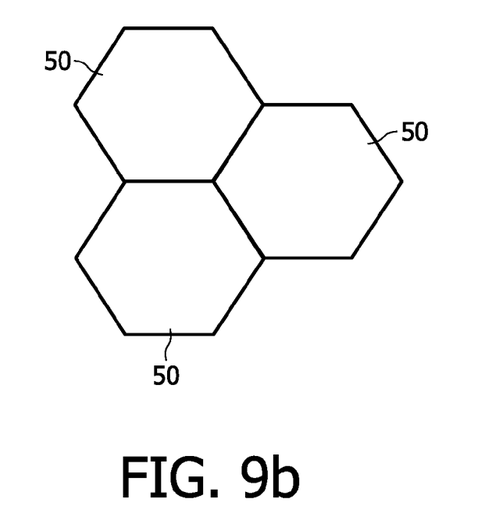
Figure 9C:
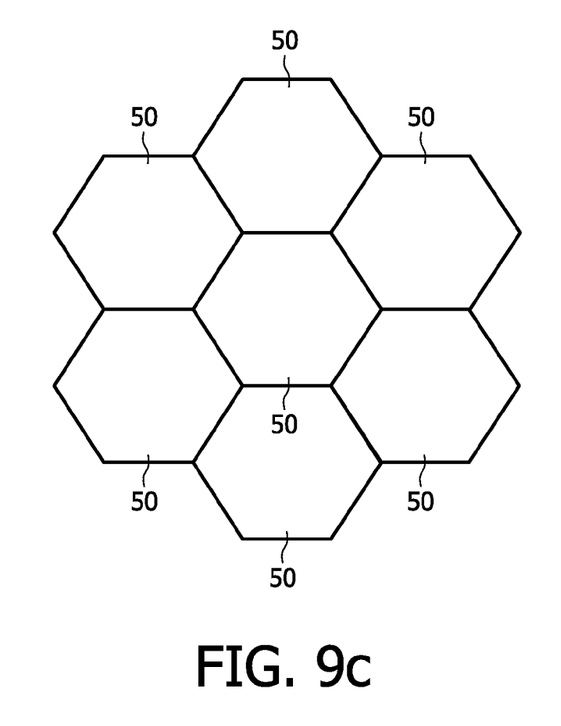

FIG. 9a is a schematic representation of a single lighting device 50 as shown in FIG. 6, while FIGS. 9b and 9c are schematic representations of three and seven lighting devices arranged in a trigonal and hexagonal configuration, respectively. The configurations shown are just examples, and many alternative forms, for example, a catenated or a circular configuration (a hexagonal configuration without the lighting device in the center) are possible without departing from the inventive concept.

Figure 10:
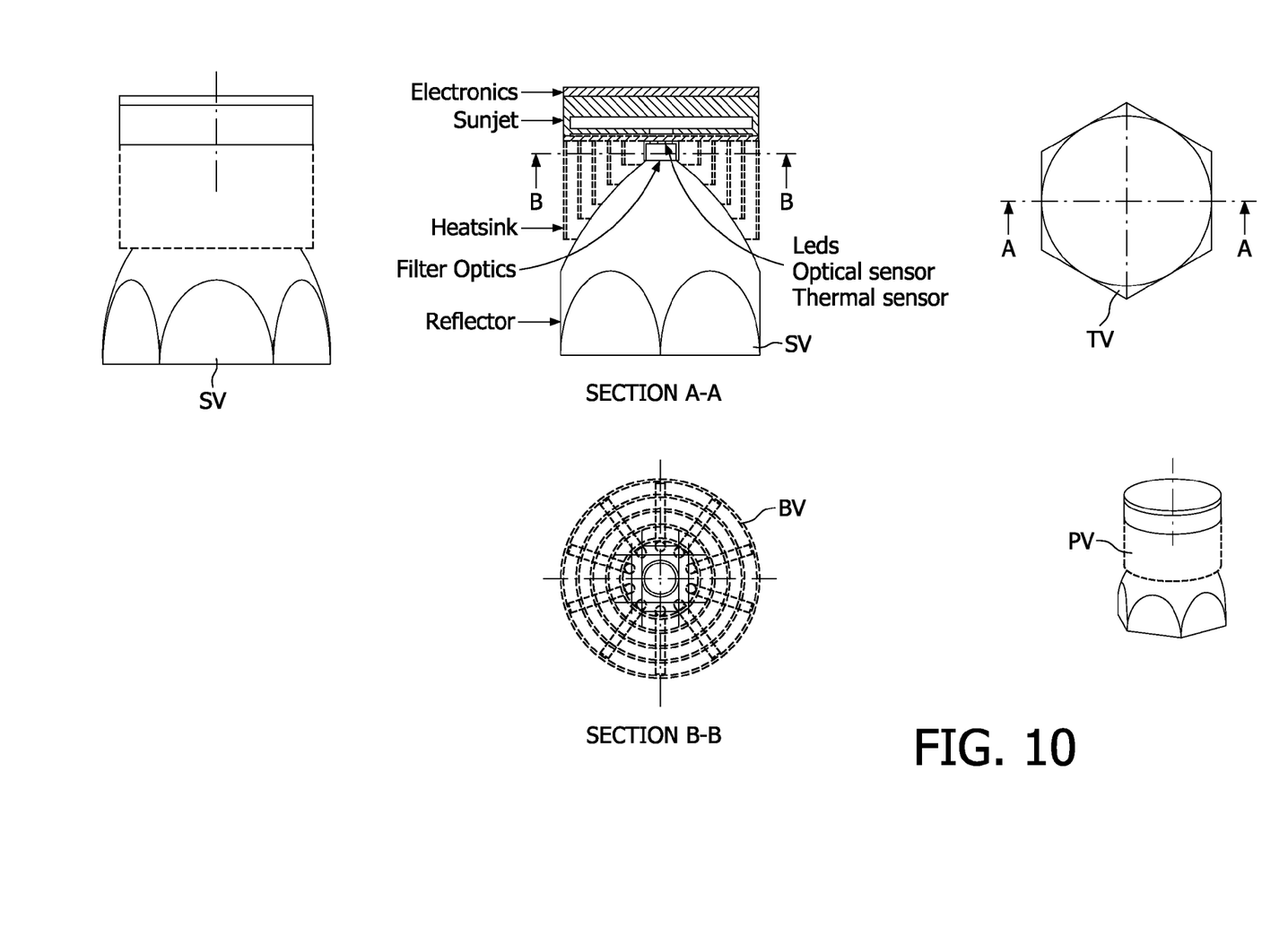
FIG. 10 shows design drawings (not to scale) of the lighting device shown in FIG. 6.

FIG. 10 shows design drawings (not to scale) of the lighting device of FIG. 6 in a perspective view PV, a side view SV, a top view TV and a bottom view BV, respectively. The heat sink has cooling fins formed as annular concentric rings.

The invention claimed is:

1. A lighting device, comprising:
   at least one light source which is mounted on at least one heat sink having a contour;
   a cooling device for dynamically cooling the light source via cooling of the heat sink by means of a fluid flowing alongside the heat sink, the cooling device having at least one cooling opening and comprising a vibrating membrane cooling system for generating a sequence of fluid pulses and a vibrating membrane chamber to which each cooling opening is connected via a respective fluid pulse conductor.

2. The lighting device as claimed in claim 1, wherein at least one cooling opening has at least two orifices arranged alongside the contour of the heat sink.

3. The lighting device as claimed in claim 1, wherein the light source comprises optical means for collimating and directing light originating from the light source during operation, the contour of the heat sink having a shape which is similar to that of the optical means.

4. The lighting device as claimed in claim 1, wherein the fluid pulse conductor has a length which is equal to N times half the wavelength λ generated by the resonator during operation.

5. The lighting device as claimed in claim 1, wherein the fluid pulse conductor is a flexible tube.

6. The lighting device as claimed in claim 1, wherein the vibrating membrane chamber is spaced apart from the light source at a distance which is at least three times larger than the largest dimension of the heat sink.

7. The lighting device as claimed in claim 1, further comprising a control circuit for controlling the cooling device.

8. The lighting device as claimed in claim 1, wherein the light source is at least one light-emitting diode (LED).

9. The lighting device as claimed in claim 8, wherein the at least one LED has a white, red, green, blue or amber emission spectrum, or any combination thereof.

10. The lighting device as claimed in claim 1, wherein the heat sink is shaped as a plurality of annular cooling fins arranged concentrically around an axis of the heat sink and spaced apart by annular slits.

11. The lighting device as claimed in claim 10, wherein the heat sink has a round, triangular, rectangular, square, hexagonal, or octagonal shape in a plane perpendicular to the axis of the heat sink.

12. The lighting device as claimed in claim 10, wherein the cooling openings are positioned in or opposite respective slits of the heat sink.

13. The lighting device as claimed in claim 1, wherein the heat sink has a generally curved outer surface.

14. The lighting device as claimed in claim 1, wherein the vibrating membrane chamber is spaced apart from the light source at a distance which is at least seven times larger than the largest dimension of the heat sink.

* * * * *